(12) United States Patent
Martinez, Jr. et al.

(10) Patent No.: US 8,080,439 B2
(45) Date of Patent: Dec. 20, 2011

(54) METHOD OF MAKING A VERTICAL PHASE CHANGE MEMORY (PCM) AND A PCM DEVICE

(75) Inventors: Arturo M. Martinez, Jr., Austin, TX (US); Rajesh A. Rao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 966 days.

(21) Appl. No.: 12/039,371

(22) Filed: Feb. 28, 2008

(65) Prior Publication Data

US 2009/0220744 A1  Sep. 3, 2009

(51) Int. Cl.
*H01L 21/00* (2006.01)
*H01L 21/06* (2006.01)
*H01L 21/8234* (2006.01)
*H01L 21/20* (2006.01)

(52) U.S. Cl. .......... 438/95; 438/102; 438/103; 438/238; 438/385; 257/E21.409; 257/E21.613; 257/E21.64; 257/E21.645

(58) Field of Classification Search ........... 257/E21.409, 257/E21.613, E21.4, E21.645
See application file for complete search history.

(56) References Cited

U.S. PATENT DOCUMENTS

| | | | | |
|---|---|---|---|---|
| 7,385,235 B2 * | 6/2008 | Lung | ............................. | 257/246 |
| 7,388,771 B2 * | 6/2008 | Ho et al. | ...................... | 365/148 |
| 7,473,921 B2 * | 1/2009 | Lam et al. | ......................... | 257/4 |
| 7,635,855 B2 * | 12/2009 | Chen et al. | ....................... | 257/4 |
| 7,772,581 B2 * | 8/2010 | Lung | ................................ | 257/3 |

OTHER PUBLICATIONS

Happ et al; "Novel One-Mask Self-Heating Pillar Phase Change Memory"; 2006 Symposium on VLSI Technology Digest of Papers, IEEE.
Song et al; "Highly Reliable 256Mb PRAM with Advanced Ring Contact Technology and Novel Encapsulating Technology"; 2006 Symposium on VLSI Technology Digest of Papers, IEEE.

* cited by examiner

*Primary Examiner* — Mohsen Ahmadi
(74) *Attorney, Agent, or Firm* — James L. Clingan, Jr.

(57) ABSTRACT

A method of making a phase change random access memory (PCM) device comprises forming a PCM stack that includes a heater layer, phase change material layer, and a top electrode layer. A top protection layer is formed overlying the PCM stack. The top protection layer and a first portion of the PCM stack are then patterned, wherein the first portion of the PCM stack excludes the heater layer. A sidewall protection feature is formed along a sidewall of the patterned top protection layer and first portion of the PCM stack. The heater layer is etched using (i) the sidewall protection feature and (ii) the patterned top protection layer and first portion of the PCM stack collectively as a mask to form a self-aligned heater layer bottom electrode of the PCRAM stack, thereby completing a memory bit of the PCRAM device.

13 Claims, 4 Drawing Sheets

METHOD OF MAKING A VERTICAL PHASE CHANGE MEMORY (PCM) AND A PCM DEVICE

BACKGROUND

1. Field

This disclosure relates generally to non-volatile memories, and more specifically, to phase change memories.

2. Related Art

Phase change memories (PCMs) have advantages over other non-volatile memories (NVMs) such as high endurance, high density and low voltage operation. There are many challenges, however, for production in large quantity. The device structure should allow for consistently being able to change the state of a cell while also having good data retention. Data retention can be a problem if the phase change material is not completely placed in the amorphous condition. If there is any crystalline material left after converting to the amorphous state, the remaining crystalline material can act as a seed for further crystalline growth. Over time, especially in the presence of heat, the phase change material can convert to the crystalline phase and thus lose its logic state. Also there must be a corresponding process that can reliably achieve the desired device structure. Although the process for making PCM devices is potentially simpler than for typical NVM devices, the process must be able to consistently provide the desired structure without creating reliability problems for the PCM device.

Thus there is a need for a PCM structure that meets the desired characteristics and a process for achieving the desired PCM structure that improves on one or more of issues pointed out above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, layers that are needed for forming a phase change memory (PCM), including a bottom conductive layer useful for a heater, are formed over active circuitry. All but the heater layer are etched according to a pattern to form a portion of a PCM stack. A sidewall spacer is formed around the portion of PCM stack. A subsequent etch, which is typically an etch that causes back sputtering of the material being etched, is then performed on the bottom conductive layer using the portion of the PCM stack and the sidewall spacer as a mask. The sidewall spacer protects the portion of the PCM stack from receiving the metal that is back sputtered during the etch of the bottom conductive layer. Thus, the PCM stack is protected from having a short that can occur resulting from the metal back sputtering that occurs during the etch of the bottom conductive layer. A contact is then made to the top of the PCM stack to form the PCM device. This is better understood by reference to the following description and drawings.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
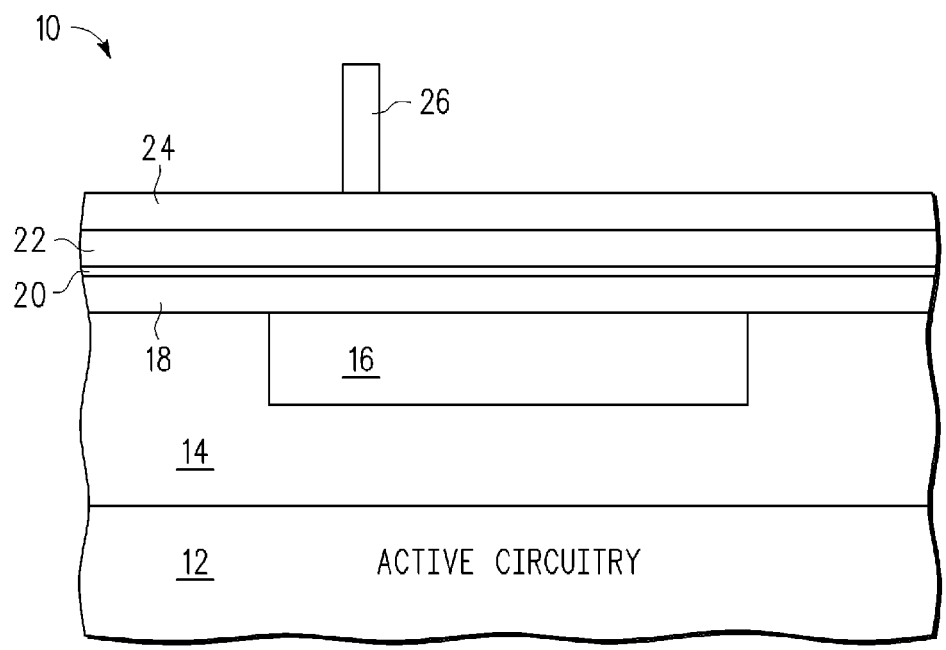
FIG. 1 is a cross section of a semiconductor device at a stage in processing according to an embodiment.

Shown in FIG. 1 is a semiconductor device 10 comprising active circuitry 12, an insulating layer 14 over active circuitry 12, a conductive layer 16 in a top portion of insulating layer 14, a conductive layer 18 over insulating layer 14 and conductive layer 16, a layer of phase change material 20 over conductive layer 18, a conductive layer 22, an anti-reflective coating (ARC) 24 over conductive layer 22, and patterned photoresist 26 over ARC 24. Active circuitry 12 is formed over and in a semiconductor substrate and is electrically coupled to conductive layer 16. Insulating layer 14 is of a material useful as an interlayer dielectric (ILD). Oxide alone or with nitride, formed as a single layer or multiple layers, may be useful for this purpose. Conductive layer 16 may be copper and may be formed in insulating layer 14 by an inlaid process. A thin barrier may be around conductive layer 16, especially if conductive layer 16 is copper. Conductive layer 18 may be titanium nitride or other material useful as a heater for a PCM device. Conductive layer 18 may alternatively be tantalum nitride (TaN), tantalum silicon nitride (TaSiN), tungsten (W), or titanium aluminum nitride (TiAlN). The resistivity of conductive layer 18 is preferably at least 1 milli-ohm-cm, which is considered highly resistive for a metal. Phase change material 20 may be made up of germanium, antimony, and tellurium (GST). As a composition this may be characterized as a $Ge_2Sb_2Te_5$. Other chalcogenides may also be useful such as ones formed by a combination of two or more of gallium (Ga), Ge, Sb, selenium (Se), sulfur (S), Te. Conductive layer 22 may be of the same material as conductive layer 18 with one such example being TiN. ARC 24 may be silicon nitride. The location of photoresist portion 26 is chosen to be over conductive layer 16. Conductive layer 16 may be used as an interconnect.

Dimensions of the various elements of semiconductor device 10 as shown in FIG. 1 are intended to aid in describing an example. They will change and are certainly expected to change as improvements in photolithography and materials occur. Patterned photoresist 26 is about 500 Angstroms wide and about 4000 Angstroms in height. ARC layer 24 may be about 1000 Angstroms thick. Conductive layer 22 may be 1000 Angstroms thick. The layer of phase change material 20 may be about 400 Angstroms thick. Conductive layer 18 may be about 1000 Angstroms thick. Conductive layer 16 may be 3000 Angstroms thick. Insulating layer 14 may be about 6000 Angstroms thick.

Figure 2:
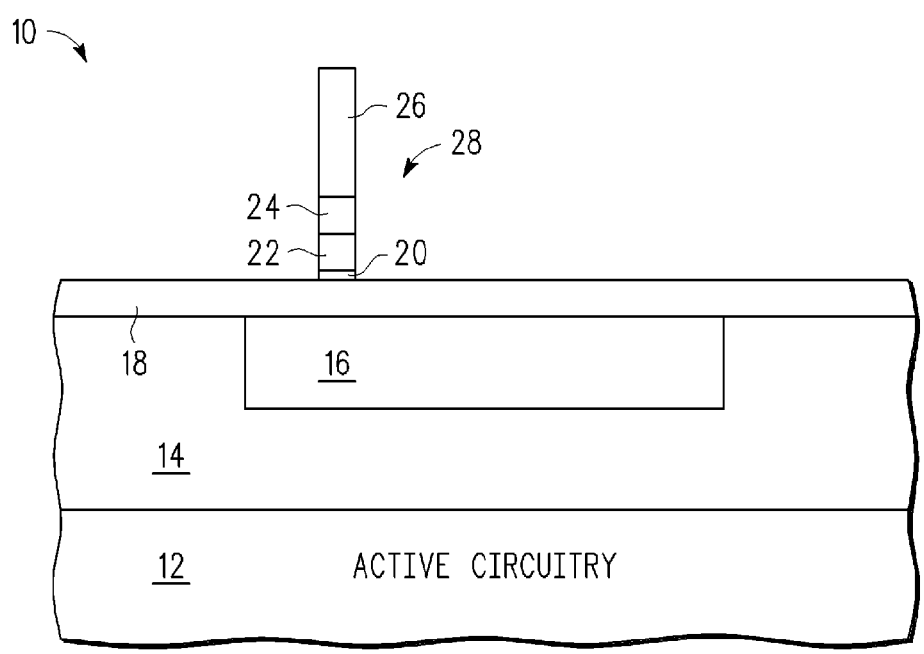
FIG. 2 is a cross section of the semiconductor device of FIG. 1 at a subsequent stage in processing.

Shown in FIG. 2 is semiconductor device 10 after etching through ARC 24, conductive layer 22, and the layer of phase change material 20 using patterned photoresist 26 as a mask. This etch is preferably an anisotropic etch such as a reactive ion etch (RIE). As the etch proceeds, the etch chemistry can change. For ARC 24 the chemistry may be bromine and fluorine based. For conductive layer 22, the chemistry may be fluorine based. For phase change material 20, the chemistry may be chlorine based. As the etch nears conductive layer 18, the chemistry is increased in concentration and the plasma power is reduced. Reducing the plasma power reduces the impact of ions and thus reduces back sputtering due to impact of ions. Thus the reducing of the plasma power is to avoid the back sputtering of material from conductive layer 14 during the over etch of phase change material 20. The over etch is to ensure that all of the phase change material is removed except in the area being masked. The chemistry for etching phase change material 20 is highly selective to conductive layer 18 so that the chemical etching has little effect on conductive layer 18. The result of the etch is patterned photoresist 26 overlying a stack 28 made up of the remaining portions of ARC 24, conductive layer 22, and phase change material 20.

Figure 3:
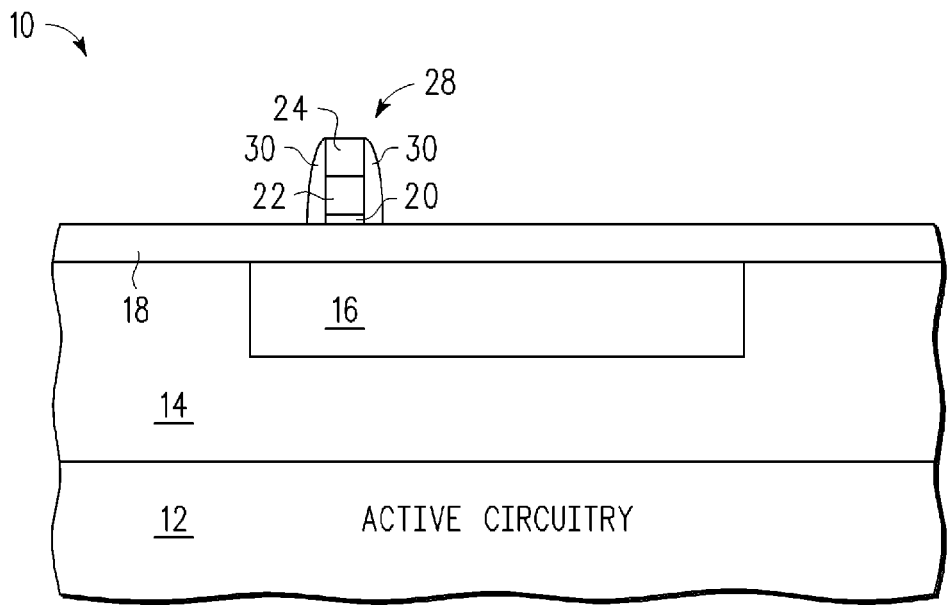
FIG. 3 is a cross section of the semiconductor device of FIG. 2 at a subsequent stage in processing.

Shown in FIG. 3 is semiconductor device 10 after removing photoresist 26 and forming a sidewall spacer 30 around stack 28. Sidewall spacer 30 may be of nitride or oxide or even a combination of sidewall spacers. Sidewall spacer 30 may extend the full height of stack 28 and may be about 500 Angstroms wide at the bottom.

Figure 4:
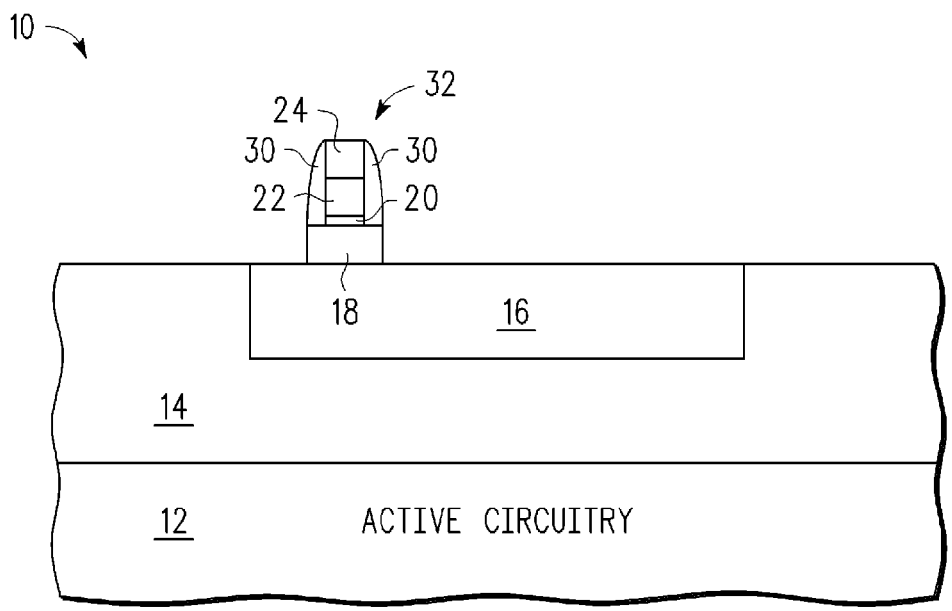
FIG. 4 is a cross section of the semiconductor device of FIG. 3 at a subsequent stage in processing.

Shown in FIG. 4 is semiconductor device 10 after performing an etch, which is preferably the same type of RIE as used in etching conductive layer 22, of conductive layer 18 using stack 28 and sidewall spacer 30 as a mask to leave a stack 32. During this etch, material from conductive layer 18 is back sputtered due to the impact of ions on conductive layer 18 during this etch. Sidewall spacer 30 blocks this back sputtered conductive material from reaching phase change material 20 and conductive layer 22 and thus prevents a short from being developed across phase change material 20. Because sidewall spacer 30 extends to the top of ARC 24, sidewall spacer 30 extends more than 2000 Angstroms above conductive layer 18. This increases as conductive layer 18 is etched. Thus, even though some conductive material will be back sputtered onto sidewall spacer 30, it will not extend continuously to the top of sidewall spacer 30. At this point then there is a stack 32 which is made up of stack 28 plus the remaining portion of conductive layer 18. Sidewall spacer 30 may also be considered part of stack 32 but it may also be removed at this point. Removal of sidewall spacer 30 may be desirable for removing the back sputtered conductive material. Whether sidewall spacer 30 is removed or not, the resulting structure has conductive layer 18 extending the width of sidewall spacer 30 past the perimeter of phase change material 20 as shown in FIG. 4. With sidewall spacer 30 having a width of about 500 Angstroms, conductive layer 18 extends about 500 Angstroms past the perimeter of phase change material 20 as shown in FIG. 4. All of conductive layer 18 of FIG. 4, which is the heater, is in contact with conductive layer 16. Also, all of the bottom surface of phase change material 20 of FIG. 4 is in contact with the heater so that a switch to the logic state defined by the amorphous state results in all of phase change material 20 being converted to amorphous. As a result, there is no crystalline remnant to act as a seed that would lead to an unwanted conversion of phase change material 20 to the crystalline phase when the device is exposed to relatively high temperatures during regular operation.

Figure 5:
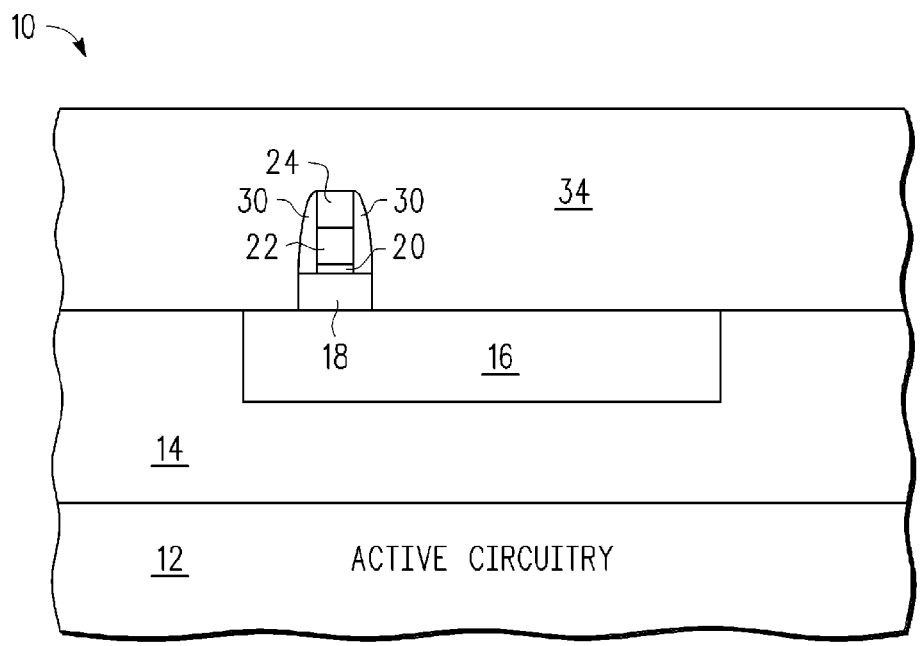
FIG. 5 is a cross section of the semiconductor device of FIG. 4 at a subsequent stage in processing.

Shown in FIG. 5 is semiconductor device 10 after forming an insulating layer 34 over insulating layer 14, stack 32, and conductive layer 16. Insulating layer is an ILD and may be formed to be the same as insulating layer 14. Further, insulating layer 34 may be planarized by chemical mechanical polishing as shown in FIG. 5

Figure 6:
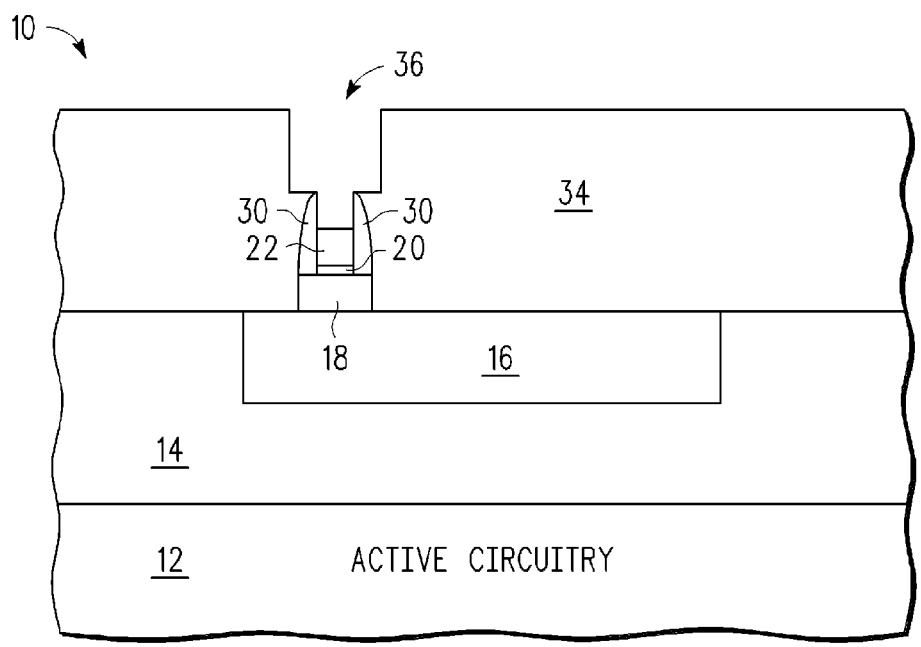
FIG. 6 is a cross section of the semiconductor device of FIG. 5 at a subsequent stage in processing.

Shown in FIG. 6 is semiconductor device 10 after forming an opening 36 over stack 32, exposing ARC 24, and removing ARC 24. Removing ARC 24 exposes conductive layer 22 as shown in FIG. 6.

Figure 7:
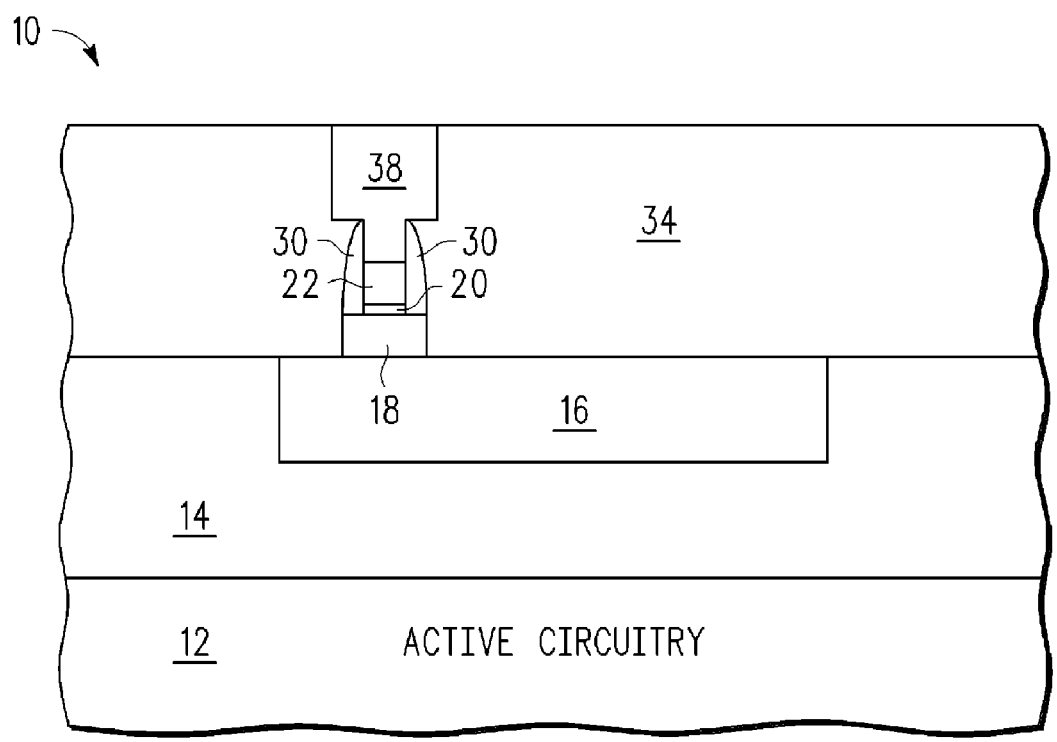
FIG. 7 is a cross section of the semiconductor device of FIG. 6 at a subsequent stage in processing.

Shown in FIG. 7 is semiconductor device 10 after forming a conductive layer 38 in opening 36. Conductive layer 38 will be electrically coupled to active circuitry 12 either in subsequent processing or vias, in a location not shown in FIG. 7, through insulating layers 14 and 34. Opening 36 is formed in a pattern for use, after being filled, as an interconnect layer or a location to which a subsequent contact may be made. This may be achieved by the known process of copper plating and subsequent chemical mechanical polishing (CMP). Semiconductor device 10 of FIG. 7 is a completed PCM cell that has a bottom heater located so as to be able to completely convert the phase change material to amorphous when desired and has contacts to an interconnect so that it can be read and written. The bottom heater is in contact with what may be an interconnect layer which in turn may be coupled to active circuitry. Similarly, the completed PCM cell has a top conductor in contact with what may be an interconnect layer which in turn may be coupled to active circuitry.

By now it should be appreciated that there has been provided a method of making a phase change random access memory (PCM) device. The method includes forming a PCM stack, wherein forming the PCM stack includes at least forming a heater layer, forming a layer of phase change material overlying the heater layer, and forming a top electrode layer overlying the layer of phase change material. The method further includes forming a top protection layer overlying the PCM stack. The method further includes patterning the top protection layer to form a patterned top protection layer and patterning a first portion of the PCM stack, wherein the first portion of the PCM stack excludes the heater layer. The method further includes forming a sidewall protection feature along a sidewall of the patterned top protection layer and first portion of the PCM stack. The method further includes etching the heater layer using (i) the sidewall protection feature and (ii) the patterned top protection layer and the first portion of the PCM stack collectively as a mask to form a self-aligned heater layer bottom electrode of the PCM stack and thereby forming a completed memory bit of the PCM device. The method may be further characterized by the heater layer comprising one of a group consisting of TiN, TaN, TaSiN, W, and TiAlN. The method may be further characterized by the heater layer comprising a highly resistive metal, wherein the highly resistive metal has a resistivity on the order of greater than or equal to 1 milli-ohm-cm. The method may be further characterized by the top electrode layer also comprising a highly resistive metal, wherein an average resistivity of the top electrode layer and the heater layer has a resistivity of at least 1 milli-ohm-cm. The method may be further characterized by the phase change material comprises two of a group consisting of Ga, Ge, Sb, Se, S, and Te. The method may be further characterized by the phase change material comprising Ge doped GaSb. The method may be further characterized by the top protection layer comprising a nitride anti-reflective coating (ARC). The method may be further characterized by the patterning including performing an etch of the top protection layer and the first portion of the PCM stack and landing either (i) on the heater layer or (ii) in the heater layer. The method may be further characterized by the sidewall protection feature comprising a dielectric sidewall spacer. The method may be further characterized by the dielectric sidewall spacer comprising one of a group consisting of an oxide and a nitride. The method may be further characterized by a bottom portion of the sidewall protection feature overlying a corresponding portion of the heater layer. The method may be further characterized by the top protection layer and the sidewall protection feature preventing any undesired back sputtering of the heater layer during the heater layer etch creating an electrical short between the heater layer and the top electrode layer. The method may further comprise forming an interlevel dielectric layer (ILD) overlying the completed memory bit, forming a contact opening in the ILD, wherein forming the contact opening in the ILD further includes removing the patterned top protection layer, and forming a top metallization contact within the contact opening. The method may further comprise forming an interlevel dielectric layer (ILD) overlying the completed memory bit, planarizing the ILD down to the top protection layer which acts as a planarization etch stop layer via chemical mechanical polishing and exposing the patterned top protection layer, forming a contact opening by removal of the exposed patterned top protection layer, and forming a contact metallization within the contact opening. The method may further comprise removing the sidewall protection feature subsequent to forming the self-aligned heater layer bottom electrode. The method may further comprise forming an interlevel dielectric layer (ILD) overlying the completed memory bit, forming a contact opening in the ILD, wherein forming the contact opening in the ILD further includes removing the patterned top protection layer, and a top metallization contact within the contact opening. The method may further comprise forming an interlevel dielectric layer (ILD) overlying the completed memory bit, planarizing the ILD down to the top protection layer which acts as a planarization etch stop layer via chemical mechanical polishing and exposing the patterned top protection layer, forming a contact opening by removal of the exposed patterned top protection layer, and forming a contact metallization within the contact opening.

Also described is a method of making a phase change random access memory (PCM) device. The method includes forming a PCM stack, wherein forming the PCM stack includes at least forming a heater layer, forming a layer of phase change material overlying the heater layer, and forming a top electrode layer overlying the phase change material layer. The method also includes forming a top protection layer overlying the PCM stack. The method also includes patterning the top protection layer to form a patterned top protection layer and patterning a first portion of the PCM stack, wherein the first portion of the PCM stack excludes the heater layer. The method also includes forming a sidewall protection feature along a sidewall of the patterned top protection layer and first portion of the PCM stack, wherein the sidewall protection feature comprises a dielectric sidewall spacer. The method also includes etching the heater layer using (i) the sidewall protection feature and (ii) the patterned top protection layer and first portion of the PCM stack collectively as a mask to form a self-aligned heater layer bottom electrode of the PCM stack and thereby completing a memory bit of the PCM device, wherein the top protection layer and the sidewall protection feature prevent any undesired back sputtering of the heater layer during the heater layer etch from creating an electrical short between the heater layer and the top electrode layer. The method may also one of a group consisting of three possible steps. A first possible step is forming an interlevel dielectric layer (ILD) overlying the completed memory bit, forming a contact opening in the ILD, wherein forming the contact opening in the ILD further includes removing the patterned top protection layer, and forming a top metallization contact within the contact opening. A second possible step is forming an interlevel dielectric layer (ILD) overlying the completed memory bit, planarizing the ILD down to the top protection layer which acts as a planarization etch stop layer via chemical mechanical polishing and exposing the patterned top protection layer to form an exposed patterned top protection layer, forming a contact opening by removal of the exposed patterned top protection layer, and forming a contact metallization within the contact opening. A third possible step is removing the sidewall protection feature subsequent to forming the self-aligned heater layer bottom electrode and prior to one of the first possible step or the second possible step.

Also disclosed is a phase change random access memory (PCM) device. A PCM stack comprising a heater layer, a layer of phase change material overlying the heater layer, and a top electrode layer overlying the phase change material layer, wherein a patterned first portion of the PCM stack excludes the heater layer. A sidewall protection feature along a sidewall of the patterned first portion of the PCM stack. A self-aligned heater layer bottom electrode of the PCM stack, wherein the self-aligned heater layer bottom electrode is formed by etching the heater layer using (i) the sidewall protection feature and (ii) the patterned first portion of the PCM stack collectively as a mask and thereby complete a memory bit of the PCM device.

Although the invention is described herein with reference to specific embodiments, various modifications and changes can be made without departing from the scope of the present invention as set forth in the claims below. For example, insulating layer 34 as shown in FIG. 5 may be planarized by CMP such that a top surface of insulating layer 34 is substantially co-planar with the top surface of ARC 24. ARC 24 may then be removed from semiconductor device 10 followed by filing the resulting opening with conductive material so as to be in contact with conductive layer 22. A subsequent insulating layer is then deposited followed by forming an interconnect layer in contact with conductive layer. Also the function of heater may be by conductive layer 22 and then the PCM cell would have a top heater and a bottom contact. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method of making a phase change random access memory (PCM) device comprising:
   forming active circuitry;
   forming an insulating layer over the active circuitry;
   forming a conductive layer in a top portion of the insulating layer;
   forming a PCM stack on the conductive layer, wherein forming the PCM stack includes:
      forming at least a heater layer,
      forming a layer of phase change material overlying the heater layer, and forming a top electrode layer overlying the layer of phase change material, forming a top protection layer overlying the PCM stack;

patterning the top protection layer to form a patterned top protection layer and patterning a first portion of the PCM stack, wherein the first portion of the PCM stack excludes the heater layer;

forming a sidewall protection feature along a sidewall of the patterned top protection layer and first portion of the PCM stack, wherein the sidewall protection feature is in direct contact with the layer of phase change material, top electrode layer and the top protection layer, and wherein the sidewall spacer protection feature comprises a dielectric sidewall spacer; and etching the heater layer using (i) the sidewall protection feature and (ii) the patterned top protection layer and the first portion of the PCM stack collectively as a mask to form a self-aligned heater layer bottom electrode of the PCM stack and thereby forming a completed memory bit of the PCM device, wherein the top protection layer and the sidewall protection feature prevent any undesired back sputtering of the heater layer during the heater layer etch from creating an electrical short between the heater layer and the top electrode layer;

forming an interlevel dielectric layer (ILD) overlying the completed memory bit after the step of removing portions of the heater layer;

planarizing the ILD down to the top protection layer which acts as a planarization etch stop layer via chemical mechanical polishing and exposing the patterned top protection layer;

forming a contact opening by removal of the exposed patterned top protection layer; and forming a contact metallization within the contact opening which is electrically coupled to the active circuitry by copper plating and subsequent chemical mechanical polishing (CMP).

2. The method of claim 1, wherein the heater layer comprises one of a group consisting of TiN, TaN, TaSiN, W, and TiAlN.

3. The method of claim 1, wherein the heater layer comprises a highly resistive metal, wherein the highly resistive metal has a resistivity of at least one milli-ohm-cm.

4. The method of claim 3, wherein the top electrode layer also comprises a highly resistive metal, wherein an average resistivity of the top electrode layer and the heater layer has a resistivity of at least 1 milli-ohm-cm.

5. The method of claim 1, wherein the phase change material comprises two of a group consisting of Ga, Ge, Sb, Se, S, and Te.

6. The method of claim 5, further wherein the phase change material comprises Ge doped GaSb.

7. The method of claim 1, wherein the top protection layer comprises a nitride anti-reflective coating (ARC).

8. The method of claim 1, wherein patterning includes performing an etch of the top protection layer and the first portion of the PCM stack and landing either (i) on the heater layer or (ii) in the heater layer.

9. The method of claim 1, wherein the dielectric sidewall spacer comprises one of a group consisting of an oxide and a nitride.

10. The method of claim 1, wherein a bottom portion of the sidewall protection feature overlies a corresponding portion of the heater layer.

11. The method of claim 1, further comprising:
forming an interlevel dielectric layer (ILD) after the step of etching the heater layer;
forming a contact opening in the ILD, wherein forming the contact opening in the ILD further includes removing the patterned top protection layer; and
forming a top metallization contact within the contact opening.

12. The method of claim 1, further comprising:
forming an interlevel dielectric layer (ILD) after the step of etching the heater layer;
planarizing the ILD down to the top protection layer which acts as a planarization etch stop layer via chemical mechanical polishing and exposing the patterned top protection layer;
forming a contact opening by removal of the exposed patterned top protection layer; and
forming a contact metallization within the contact opening.

13. The method of claim 1, still further comprising:
forming an interlevel dielectric layer (ILD) overlying the completed memory bit after the step of removing portions of the heater layer;
forming a contact opening in the ILD, wherein forming the contact opening in the ILD further includes removing the patterned top protection layer; and
forming a top metallization contact within the contact opening.

* * * * *